United States Patent
Wu et al.

(10) Patent No.: US 10,109,768 B2
(45) Date of Patent: Oct. 23, 2018

(54) LIGHT EMITTING DIODE CHIP

(71) Applicant: PlayNitride Inc., Tainan (TW)

(72) Inventors: Jyun-De Wu, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/643,485

(22) Filed: Jul. 7, 2017

(65) Prior Publication Data
US 2018/0166607 A1 Jun. 14, 2018

(30) Foreign Application Priority Data
Dec. 8, 2016 (TW) .............................. 105140653 A

(51) Int. Cl.
- *H01L 33/20* (2010.01)
- *H01L 33/06* (2010.01)
- *H01L 33/30* (2010.01)
- H01L 33/40 (2010.01)
- H01L 33/42 (2010.01)

(52) U.S. Cl.
CPC .............. *H01L 33/20* (2013.01); *H01L 33/06* (2013.01); *H01L 33/30* (2013.01); *H01L 33/405* (2013.01); *H01L 33/42* (2013.01)

(58) Field of Classification Search
CPC ......... H01L 33/20; H01L 33/06; H01L 33/42; H01L 33/405
See application file for complete search history.

(56) References Cited

U.S. PATENT DOCUMENTS

| | | | | |
|---|---|---|---|---|
| 4,972,238 A | * | 11/1990 | Tanaka | H01S 5/227 372/44.01 |
| 2003/0020104 A1 | * | 1/2003 | Talin | H01L 21/8221 257/295 |
| 2004/0061433 A1 | * | 4/2004 | Izuno | H01L 21/76251 313/498 |
| 2006/0043392 A1 | * | 3/2006 | Kurahashi | H01L 33/0079 257/91 |
| 2006/0273342 A1 | | 12/2006 | Lai et al. | |
| 2009/0206354 A1 | * | 8/2009 | Kitano | H01L 33/387 257/98 |
| 2010/0051994 A1 | * | 3/2010 | Katsuno | H01L 33/387 257/98 |
| 2010/0133529 A1 | * | 6/2010 | Taraschi | G03B 21/28 257/43 |
| 2010/0213513 A1 | * | 8/2010 | Zampardi | H01L 29/66174 257/201 |

OTHER PUBLICATIONS

"Office Action of Taiwan Counterpart Application," dated May 15, 2017, p. 1-p. 3, in which the listed reference was cited.

* cited by examiner

*Primary Examiner* — Phuc Dang
(74) *Attorney, Agent, or Firm* — JCIPRNET

(57) ABSTRACT

A light-emitting diode chip including a p-type semiconductor layer, a light-emitting layer and an n-type semiconductor layer is provided. The light-emitting layer is disposed between the p-type semiconductor layer and the n-type semiconductor layer. A ratio of a sum of thicknesses of all semiconductor layers of the light-emitting diode chip over a maximum width of the light-emitting diode chip ranges from 0.02 to 1.5. A ratio of a sum of thicknesses of all semiconductor layers located in a side of the light-emitting layer toward the p-type semiconductor layer over the sum of thicknesses of all semiconductor layers of the light-emitting diode chip ranges from 0.05 to 0.2.

11 Claims, 2 Drawing Sheets

LIGHT EMITTING DIODE CHIP

CROSS-REFERENCE TO RELATED APPLICATION

This application claims the priority benefit of Taiwan application serial no. 105140653, filed on Dec. 8, 2016. The entirety of the above-mentioned patent application is hereby incorporated by reference herein and made a part of this specification.

BACKGROUND OF THE DISCLOSURE

Field of the Disclosure

The disclosure relates to a light emitting element, and particularly to a light emitting diode chip.

Description of Related Art

Micro light emitting diode (μLED) display includes a display substrate and a plurality of μLED chips electrically connected with the display substrate. Each pixel region of the μLED display is provided with a corresponding μLED chip, and each μLED chip can emit light independently. With the characteristic of LED, the μLED display has the advantages of being low-power consumption, high brightness, color saturation, fast respond speed, power-saving, etc. In addition, the μLED display is superior with good material stability and non-image sticking. Therefore, the display technology of μLED display has drawn much attention.

To make the μLED display to have high resolution, it is required that each μLED chip be designed with small area. However, when the area of μLED chip is reduced (e.g. at the level of a plurality of square microns), the electron and hole in the μLED chip are easily transmitted to a side wall of the μLED chip and combined in the defect of the side wall with no emission of light, which is not preferable for the light-emitting property of the μLED chip. Besides, an originally overly-thick semiconductor layer is likely to absorb light due to minimization of the size of μLED chip, causing the efficiency of the μLED chip to become inferior.

SUMMARY OF THE DISCLOSURE

The disclosure provides a light emitting diode (LED) chip having good performance with smaller area and thinner thickness.

In the disclosure, the LED chip comprises a p-type semiconductor layer, a light-emitting layer and an n-type semiconductor layer. The light-emitting layer is disposed between the p-type semiconductor layer and the n-type semiconductor layer. A ratio of the sum of thicknesses of all semiconductor layers of the LED chip over a maximum width of the LED chip ranges from 0.02 to 1.5. A ratio of a sum of thicknesses of all semiconductor layers located in a side of the light-emitting layer toward the p-type semiconductor layer over the sum of thicknesses of all semiconductor layers of the LED chip ranges from 0.05 to 0.2.

In one embodiment of the disclosure, the p-type semiconductor layer comprises a p-type cladding layer and a p-type ohmic contact layer. The p-type cladding layer is disposed between the p-type ohmic contact layer and the light-emitting layer.

In one embodiment of the disclosure, the sum of thicknesses of all semiconductor layers located in a side of the light-emitting layer toward the p-type semiconductor layer is a sum of thickness of the p-type cladding layer and the p-type ohmic contact layer.

In one embodiment of the disclosure, a ratio of the thickness of the p-type ohmic contact layer over the sum of thicknesses of all semiconductor layers of the LED chip is greater than 0 and less than or equivalent to 0.05.

In one embodiment of the disclosure, a ratio of the thickness of the p-type ohmic contact layer over the sum of thicknesses of all semiconductor layers located in a side of the light-emitting layer toward the p-type semiconductor layer ranges from 0.1 to 0.25.

In one embodiment of the disclosure, the material of the p-type ohmic contact layer is carbon-doped gallium phosphide (GaP).

In one embodiment of the disclosure, the material of the p-type cladding layer is aluminum indium phosphide (AlInP).

In one embodiment of the disclosure, the n-type semiconductor layer comprises an n-type cladding layer and an etch-stop layer. The n-type cladding layer is disposed between the light-emitting layer and the etch-stop layer.

In one embodiment of the disclosure, the material of the etch-stop layer is gallium arsenide (GaAs), and the thickness of the etch-stop layer is less than or equal to 600 Å.

In one embodiment of the disclosure, the n-type semiconductor layer may further comprise an n-type semiconductor sub-layer. The n-type cladding layer is disposed between the light-emitting layer and n-type semiconductor sub-layer. The n-type semiconductor sub-layer is disposed between the n-type cladding layer and etch-stop layer.

Based on the above, in one embodiment of the disclosure, the ratio of the sum of thicknesses of all semiconductor layers of the LED chip over the maximum width of the LED chip ranges from 0.02 to 1.5; the ratio of the sum of thicknesses of all semiconductor layers located in a side of the light-emitting layer toward the p-type semiconductor layer over the sum of thicknesses of all semiconductor layers of the LED chip ranges from 0.05 to 0.2. In other words, in one embodiment of the disclosure, the LED chip omits at least one semiconductor layer (e.g. current-spreading layer) located in a side of the light-emitting layer toward the p-type semiconductor layer, thereby attaining the advantage of slimness. More importantly, with the omission of at least one semiconductor layer (e.g. current-spreading layer) located in a side of the light-emitting layer toward the p-type semiconductor layer, the electron and hole in the LED chip are less likely to be transmitted to the side wall of the LED chip, and are not easily combined in the defect on the side wall with no emission of light, thereby improving the light-emitting performance of the LED chip.

In order to make the aforementioned features and advantages of the disclosure more comprehensible, embodiments accompanying figures are described in detail below.

DESCRIPTION OF EMBODIMENTS

Figure 1A:
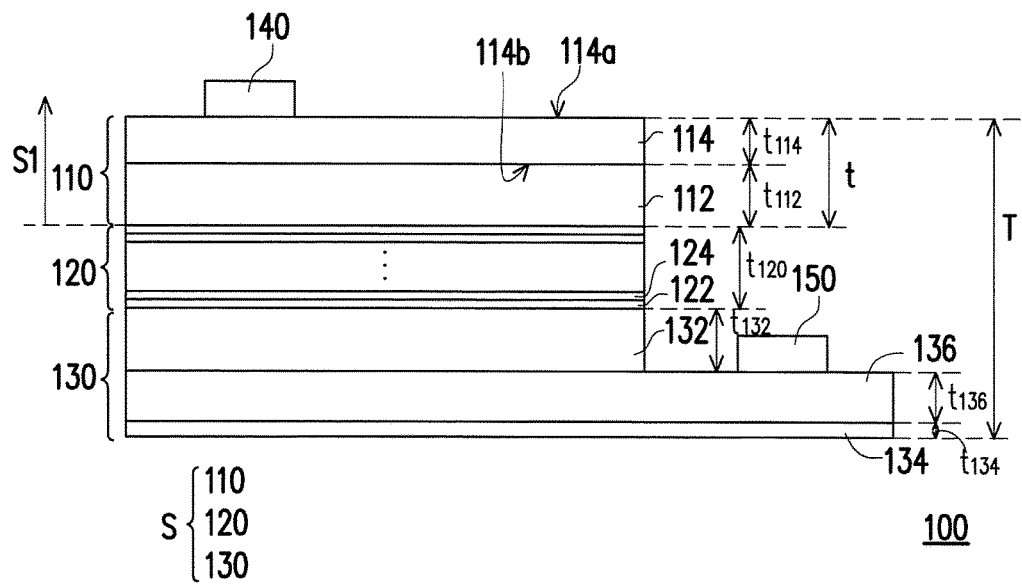
FIG. 1A is a sectional view of a light emitting diode (LED) chip according one embodiment of the disclosure.

FIG. 1A is a sectional view of a light emitting diode (LED) chip according one embodiment of the disclosure.

Figure 1B:
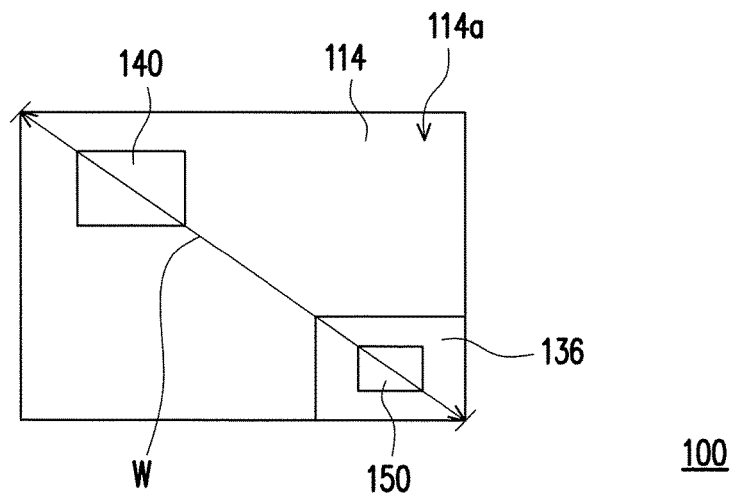
FIG. 1B is a top view of the LED chip in FIG. 1A.

FIG. 1B is a top view of the LED chip in FIG. 1A. Referring to FIGS. 1A and 1B, an LED chip 100 comprises a p-type semiconductor layer 110, a light-emitting layer 120 and an n-type semiconductor layer 130. The light-emitting layer 120 is disposed between the p-type semiconductor layer 110 and n-type semiconductor layer 130. In the embodiment, the light-emitting layer 120 is configured to emit red light. In other words, the LED chip 100 is a red-light LED chip.

In the embodiment, the light-emitting layer 120 may be a multiple quantum well structure. Specifically, the light-emitting layer 120 comprises a plurality of barrier layers 122 and a plurality of well layers 124 alternately stacked on each other, wherein an energy gap of the barrier layer 122 is larger than the energy gap of the well layer 124. In the embodiment, the material of the barrier layer 122 and the material of the well layer 124 are both aluminum gallium indium phosphide (AlGaInP), for example, but the molar percentage of aluminum and gallium contained in the barrier layer 122 is different from the molar percentage of aluminum and gallium contained in the well layer 124. For example, the material of the barrier layer 122 may be undoped $(Al_xGa_{1-x})_{0.5}In_{0.5}P$; the material of the well layer 124 may be undoped $(Al_yGa_{1-y})_{0.5}In_{0.5}P$, wherein 0<x<1, 0<y<1, but the disclosure is not limited thereto. In other embodiments, the barrier layer 122 and the well layer 124 may be formed of other suitable materials. In the embodiment, a thickness $t_{120}$ of the light-emitting layer 120 ranges from about 2500 Å to about 4500 Å, for example, but the disclosure is not limited thereto.

In the embodiment, the p-type semiconductor layer 110 comprises a p-type cladding layer 112 and a p-type ohmic contact layer 114. The p-type cladding layer 112 is disposed between the p-type ohmic contact layer 114 and the light-emitting layer 120. To be more specifically, in the embodiment, the p-type cladding layer 112 may directly contact the light-emitting layer 120, and the p-type ohmic contact layer 114 may be a film in the p-type semiconductor layer farthest from the light-emitting layer 120. In the embodiment, the semiconductor layer disposed above the p-type cladding layer 122 may be provided with the p-type ohmic contact layer 114 only for ohmic contact with a conductive layer (e.g. first electrode 140 in the embodiment) in the subsequent process so as to achieve slim thickness of the semiconductor layer and avoid absorbing light.

In the embodiment, the p-type cladding layer 112 is a single film formed of consistent material. The material of the p-type cladding layer 112 is, for example, Mg-doped aluminum indium phosphide ($Al_{0.5}In_{0.5}P$). A thickness $t_{112}$ of the p-type cladding layer 112 ranges from 2500 Å to 8000 Å, for example, preferably less than 3000 Å to avoid absorption of light. The p-type ohmic contact layer 114 is a single film formed of consistent material. The material of the p-type ohmic contact layer 114 may be carbon-doped gallium phosphide (GaP) so as to have better ohmic contact efficiency with the conductive layer (e.g. first electrode 140 in the embodiment) in the subsequent process. A thickness $t_{114}$ of the p-type ohmic contact layer 114 is less than or equal to 1000 Å, thereby achieving slimness to avoid the semiconductor layer from being overly thick and absorbing light while attaining good ohmic contact effect. It should be pointed out that a ratio of the thickness of p-type ohmic contact layer 114 over a sum of thicknesses of all semiconductor layers of the p-type semiconductor layer 110 ranges from 0.1 to 0.25. If the ratio is smaller than 0.1, the p-type ohmic contact layer 114 is likely to be overly thin and cannot have good ohmic contact efficiency. If the ratio is larger than 0.25, the p-type ohmic contact layer 114 is likely to be overly thick and cause absorption of light. In prior art, there exists a multi-layered semiconductor layer of which the sum of thickness is larger than 10000 Å after the p-type cladding layer is formed; in comparisons, in the present application, there exists only the p-type ohmic contact layer 114 after the p-type cladding layer 112 is formed. The number of all semiconductor layers of the p-type semiconductor layer 110 is less than the number of all semiconductor layers of the n-type semiconductor layer 130 so that the sum of thickness of the semiconductor layer can be effectively slimed. No matter whether the material of the first electrode 140 is a light-transmittable material (e.g. indium tin oxide, ITO) or a non-light-transmittable material (e.g. metal), the carbon-doped gallium phosphide (e.g. p-type ohmic contact layer 114) and the first electrode 140 can form good ohmic contact in both cases, thereby improving the performance of the LED chip 100, but the disclosure is not limited thereto. It should be indicated that the first electrode 140 and the p-type ohmic contact layer 114 may fully contact each other or partially contact each other to increase current spreading. In other embodiments, the material of the p-type cladding layer 112, the thickness $t_{112}$ of the p-cladding layer 112, the material of the p-type ohmic contact layer 114 and/or the thickness $t_{114}$ of the p-type ohmic contact layer 114 may be designed in another suitable manner.

In the embodiment, the n-type semiconductor layer 130 comprises an n-type cladding layer 132 and an etch-stop layer 134. The n-type cladding layer 132 is disposed between the light-emitting layer 120 and the etch-stop layer 134. To be more specifically, in the embodiment, the n-type cladding layer 132 may directly contact the light-emitting layer 120, and the etch-stop layer 134 may be a film in the n-type semiconductor layer 130 farthest from the light-emitting layer 120. In the embodiment, the n-type semiconductor layer 130 may further comprise an n-type semiconductor sub-layer 136 disposed between the n-type cladding layer 132 and the etch-stop layer 134. The n-type cladding layer 132 is disposed between the light-emitting layer 120 and the n-type semiconductor sub-layer 136. The n-type semiconductor sub-layer 136 is disposed between the n-type cladding layer 132 and the etch-stop layer 134.

In the embodiment, the LED chip 100 may be a micro light-emitting diode (μLED). A plurality of μLED chips may grow on a growth substrate (not shown). Thereafter, an etching method or the like is used to detach the μLED chips from the growth substrate and the semiconductor layer (not shown) that is between the growth substrate (not shown) and the etch-stop layer 134. The etch-stop layer 134 of each LED chip 100 can protect the corresponding n-type semiconductor sub-layer 136 from being damaged during etching process.

In the embodiment, the material of the n-type cladding layer 132 and the material of the n-type semiconductor layer 136 are both aluminum gallium indium phosphide, for example, but the molar percentage of aluminum and gallium contained in the n-type cladding layer 132 is different from the molar percentage of aluminum and gallium contained in the n-type semiconductor layer 136. For example, the material of the n-type semiconductor sub-layer 136 and the material of the n-type cladding layer 132 may be aluminum gallium indium phosphide $(Al_mGa_{1-m})_{0.5}In_{0.5}P$ and aluminum gallium indium phosphide $(Al_nGa_{1-n})_{0.5}In_{0.5}P$ respectively which have different proportions of constitutions, wherein 0<m≤1 and 0<n≤1. The aluminum gallium indium phosphide $(Al_mGa_{1-n})_{0.5}In_{0.5}P$ and the aluminum gallium indium phosphide $(Al_nGa_{1-n})_{0.5}In_{0.5}P$ are dopped with silicone (Si), for example. The material of the etch-stop layer 134 may be the n-type semiconductor layer such as Si-doped gallium arsenide (GaAs). In the embodiment, a thickness $t_{132}$ of the n-type cladding layer 132 ranges from about 3000 Å to about 5000 Å, for example. A thickness $t_{136}$ of the n-type semiconductor sub-layer 136 ranges from about 10000 Å to about 12000 Å. The thickness $t_{134}$ of the etch-stop layer 134 is about less than or equal to 600 Å, for example, which should not be construed as a limitation to the disclosure. As compared with conventional red-light LED chips, the thicknesses of the semiconductors of the disclosure are slimmed. In other embodiments, the material of the n-type cladding layer 132, the material of the n-type semiconductor sub-layer 136, the material of the etch-stop layer 134, the thickness $t_{132}$ of the n-type cladding layer 132, the thickness $t_{136}$ of the n-type semiconductor sub-layer 136 and/or the thickness $t_{134}$ of the etch-stop layer 134 may also be designed in another suitable manner.

In the embodiment, the LED chip 100 further comprises a first electrode 140 and a second electrode 150. The first electrode 140 and the p-type semiconductor layer 110 are electrically connected. The second electrode 150 and the n-type semiconductor layer 130 are electrically connected. Specifically, in the embodiment, the first electrode 140 is disposed on the p-type ohmic contact layer 114 and in contact with the p-type ohmic contact layer 114. Two opposite sides 114a and 114b of the p-type ohmic contact layer 114 are respectively in contact with the first electrode 140 and the p-type cladding layer 112. The etch-stop layer 134, the n-type semiconductor sub-layer 136, the n-type cladding layer 132, the light-emitting layer 120, the p-type cladding layer 112 and the p-type ohmic contact layer 114 are sequentially stacked into a semiconductor structure S. In the embodiment, the first electrode 140 and the second electrode 150 may be configured on the same side of the semiconductor structure S. In other words, in the embodiment, the LED chip 100 may be a lateral LED chip, which should not be construed as a limitation to the disclosure.

A ratio T/W of the sum of thicknesses T of all semiconductor layers of the LED chip 100 over a maximum width W of the LED chip 100 ranges from 0.02 to 1.5. In other words, the size of the LED chip 100 may be smaller such as the size of μLED. Preferably, a ratio T/W of the sum of thicknesses T of all semiconductor layers of the LED chip 100 over a maximum width W of the LED chip 100 ranges from 0.2 to 1.5 to achieve a better light-emitting efficiency. In one embodiment, the maximum width W falls within a range from 1 μm to 100 μm, for example. It should be specifically described that the LED chip 100 of the present application is suitable for use within a low-current density range with the current density of 0.001 Amp/cm² to 4 Amp/cm² to achieve a better light-emitting efficiency. It should also be pointed out that a ratio of the sum of thicknesses t of all semiconductor layers located in a side S1 of the light-emitting layer 120 toward the p-type semiconductor layer 110 over the sum of thicknesses T of all semiconductor layers of the LED chip 100 ranges from 0.05 to 0.2. When the ratio is smaller than 0.05, the efficiency of the LED chip 100 becomes inferior; when the ratio is larger than 0.2, the light emitted by the LED chip is absorbed. Preferably, the ratio falls with the range of 0.05 to 0.1, which may allow the LED chip 100 to achieve a better light-emitting efficiency and slimness. In other words, as compared with conventional LEDs that the ratios of the sum of thicknesses of all semiconductor layers located in a side of the light-emitting layer toward the p-type semiconductor layer over the sum of thicknesses of all semiconductor layers of the LED chip are larger than 0.5, the LED chip 100 of the present application omits at least one semiconductor layer (e.g. current-spreading layer) located in a side S1 of the light-emitting layer 120 toward the p-type semiconductor layer 110 and therefore has the advantage of slimness. It is also important to point out that, with the omission of at least one semiconductor layer (e.g. current-spreading layer) located in the side S1 of the light-emitting layer 120 toward the p-type semiconductor layer 110, the electron and hole in the LED chip 100 are less likely to be scattered to the side wall of the semiconductor structure S, and are not easily combined in the defect on the side wall of the semiconductor structure S with no emission of light, thereby improving the light-emitting performance of the LED chip 100.

In the embodiment, the sum of thicknesses T of all semiconductor layers of the LED chip 100 maybe a sum of the thickness $t_{134}$ of the etch-stop layer 134, the thickness $t_{136}$ of the n-type semiconductor sub-layer 136, the thickness $t_{132}$ of the n-type cladding layer 132, the thickness $t_{120}$ of the light-emitting layer 120, the thickness $t_{112}$ of the p-type cladding layer 112 and the thickness $t_{114}$ of the p-type ohmic contact layer 114, which should not be construed as a limitation to the disclosure. In the embodiment, the sum of thicknesses t of all semiconductor layers located in a side S1 of the light-emitting layer 120 toward the p-type semiconductor layer 110 may be the sum of thickness $t_{112}$ of the p-type cladding layer 112 and the thickness $t_{114}$ of the p-type ohmic contact layer 114, i.e. the sum of thicknesses of all p-type semiconductor layers, which should not be construed as a limitation to the disclosure. In the embodiment, the ratio of the thickness $t_{114}$ of the p-type ohmic contact layer 114 over the sum of thicknesses T of all semiconductor layers of the LED chip 100 is larger than 0 and smaller than or equal to 0.05. If the ratio is larger than 0.05, the p-type ohmic contact layer 114 may be overly thick and absorb light.

Figure 2A:
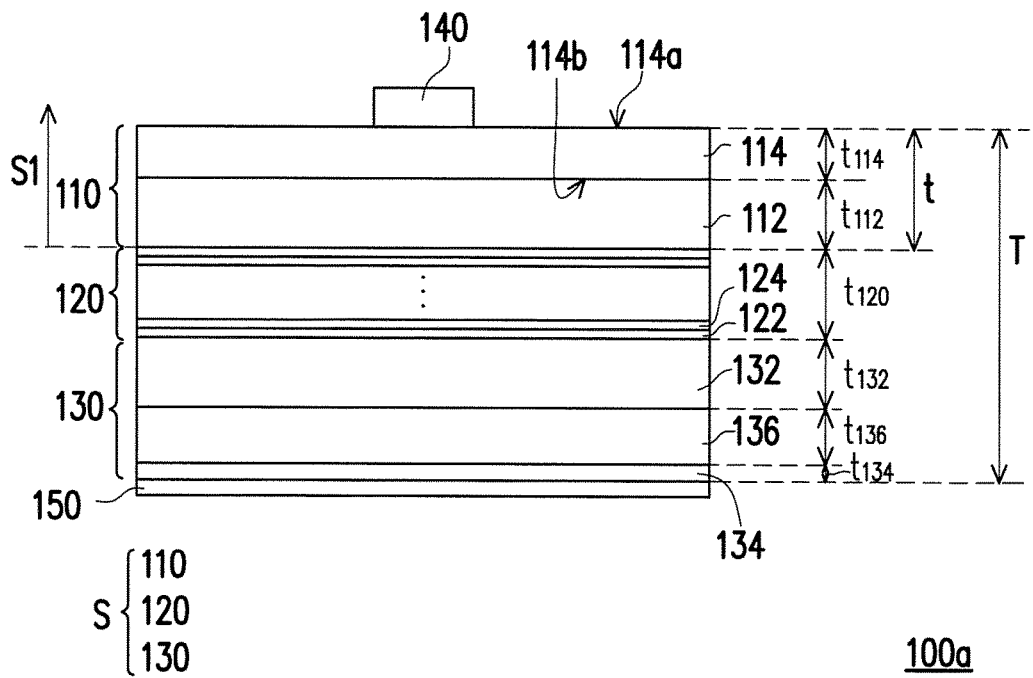
FIG. 2A is a sectional view of an LED chip according to another embodiment of the disclosure.
Figure 2B:
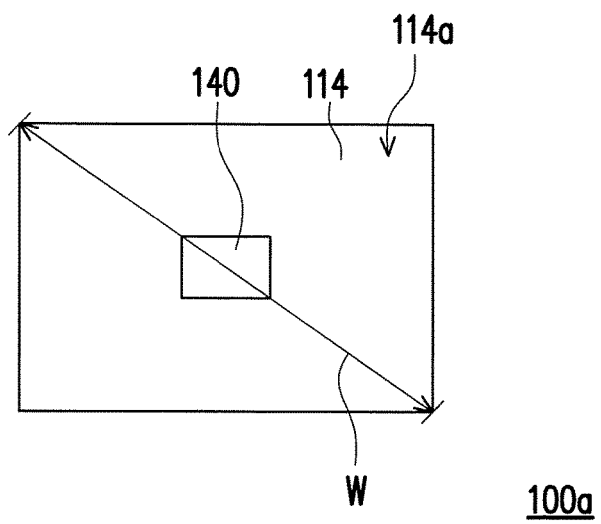
FIG. 2B is a top view of the LED chip in FIG. 2A.

FIG. 2A is a sectional view of an LED chip according to another embodiment of the disclosure. FIG. 2B is a top view of the LED chip in FIG. 2A. Referring to FIGS. 2A and 2B, an LED chip 100a is similar to the LED chip 100 in FIGS. 1A and 1B. Therefore, identical or corresponding elements are denoted by identical or corresponding reference numerals. The difference between the LED chip 100a and the LED chip 100 is that the LED chip 100a is a vertical LED chip, for example. Specifically, the etch-stop layer 134, the n-type semiconductor sub-layer 136, the n-type cladding layer 132, the light-emitting layer 120, the p-type cladding layer 112 and the p-type ohmic contact layer 114 may be sequentially stacked into the semiconductor structure S; the first electrode 140 and the second electrode 150 may be disposed on two opposite sides of the semiconductor structure S. In the embodiment, the etch-stop layer 134 is the n-type ohmic contact layer. The second electrode 150 is disposed on the etch-stop layer 134 and forms ohmic contact with the etch-stop layer 134.

In summary, in one embodiment of the disclosure, the ratio of the sum of thicknesses of all semiconductor layers of the LED chip over the maximum width of the LED chip ranges from 0.02 to 1.5. The ratio of the sum of thicknesses of all semiconductor layers located in a side of the light-emitting layer toward the p-type semiconductor layer over the sum of thicknesses of all semiconductor layers of the LED chip ranges from 0.05 to 0.2. In other words, the LED chip in one embodiment of the disclosure omits at least one semiconductor layer (e.g. current-spreading layer) located in a side of the light-emitting layer toward the p-type semiconductor layer and has the advantage of slim size. In particular, with the omission of at least one semiconductor layer (e.g. current-spreading layer) located in a side of the light-emitting layer toward the p-type semiconductor layer, the electron and hole in the LED chip are less likely to be scattered to the side wall of the LED chip, and are not easily combined in the defect on the side wall with no emission of light, thereby improving the light-emitting performance of the LED chip.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A micro light emitting diode (micro LED) chip, comprising:
   a p-type semiconductor layer, wherein the p-type semiconductor layer comprises:
      a p-type cladding layer; and
      a p-type ohmic contact layer, wherein a material of the p-type ohmic contact layer is a carbon-doped gallium phosphide;
   a light-emitting layer, wherein the p-type cladding layer is disposed between the p-type ohmic contact layer and the light-emitting layer; and
   an n-type semiconductor layer, wherein the light-emitting layer is disposed between the p-type semiconductor layer and the n-type semiconductor layer, a ratio of a sum of thicknesses of all semiconductor layers of the micro LED chip over a maximum width of the micro LED chip ranges from 0.02 to 1.5, and a ratio of a sum of thicknesses of all semiconductor layers located in a side of the light-emitting layer toward the p-type semiconductor layer over the sum of thicknesses of all semiconductor layers of the micro LED chip ranges from 0.05 to 0.2.

2. The micro LED chip according to claim 1, wherein the sum of thicknesses of all semiconductor layers located in the side of the light-emitting layer toward the p-type semiconductor layer is a sum of a thickness of the p-type cladding layer and a thickness of the p-type ohmic contact layer.

3. The micro LED chip according to claim 1, wherein a ratio of a thickness of the p-type ohmic contact layer over the sum of thicknesses of all semiconductor layers of the micro LED chip is larger than 0 and smaller than or equal to 0.05.

4. The micro LED chip according to claim 1, wherein a ratio of a thickness of the p-type ohmic contact layer over the sum of thicknesses of all semiconductor layers located in the side of the light-emitting layer toward the p-type semiconductor layer ranges from 0.1 to 0.25.

5. The micro LED chip according to claim 1, wherein a material of the p-type cladding layer is aluminum indium phosphide.

6. The micro LED chip according to claim 1, wherein the n-type semiconductor layer comprises:
   a n-type cladding layer; and
   an etch-stop layer, wherein the n-type cladding layer is disposed between the light-emitting layer and the etch-stop layer.

7. The micro LED chip according to claim 6, wherein a material of the etch-stop layer is gallium arsenide, and a thickness of the etch-stop layer is smaller than or equal to 600 Å.

8. The micro LED chip according to claim 6, wherein the n-type semiconductor layer further comprises:
   a n-type semiconductor sub-layer, wherein the n-type cladding layer is disposed between the light-emitting layer and the n-type semiconductor sub-layer, and the n-type semiconductor sub-layer is disposed between the n-type cladding layer and the etch-stop layer.

9. The micro LED chip according to claim 1, further comprising: a first electrode and a second electrode which are respectively electrically connected to the p-type semiconductor layer and the n-type semiconductor layer, wherein the p-type cladding layer is in direct contact with the light emitting layer, the p-type ohmic contact layer is in direct contact with the p-type cladding layer, and the first electrode is in direct contact with the p-type ohmic contact layer.

10. A micro light emitting diode (micro LED) chip, comprising:
    a p-type semiconductor layer;
    a light-emitting layer; and
    an n-type semiconductor layer, wherein the light-emitting layer is disposed between the p-type semiconductor layer and the n-type semiconductor layer, a ratio of a sum of thicknesses of all semiconductor layers of the micro LED chip over a maximum width of the micro LED chip ranges from 0.02 to 1.5, and a ratio of a sum of thicknesses of all semiconductor layers located in a side of the light-emitting layer toward the p-type semiconductor layer over the sum of thicknesses of all semiconductor layers of the micro LED chip ranges from 0.05 to 0.2,
    wherein the number of all semiconductor layers of the p-type semiconductor layer is less than the number of all semiconductor layers of the n-type semiconductor layer.

11. The micro LED chip according to claim 10, further comprising: a first electrode and a second electrode which are respectively electrically connected to the p-type semiconductor layer and the n-type semiconductor layer, wherein the p-type semiconductor layer comprises a p-type cladding layer and a p-type ohmic contact layer, the p-type cladding layer is disposed between the p-type ohmic contact layer and the light-emitting layer, the p-type cladding layer is in direct contact with the p-type cladding layer, and the first electrode is in direct contact with the p-type ohmic contact layer.

* * * * *